US008086190B2

(12) United States Patent
Rofougaran

(10) Patent No.: US 8,086,190 B2

(45) Date of Patent: Dec. 27, 2011

(54) METHOD AND SYSTEM FOR RECONFIGURABLE DEVICES FOR MULTI-FREQUENCY COEXISTENCE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 639 days.

(21) Appl. No.: 12/056,475

(22) Filed: Mar. 27, 2008

(65) Prior Publication Data

US 2009/0243779 A1 Oct. 1, 2009

(51) Int. Cl.
*H04B 1/04* (2006.01)

(52) U.S. Cl. .................. 455/103; 455/552.1; 455/426.2; 455/41.2; 455/88; 455/42; 340/10.1; 340/572.7

(58) Field of Classification Search .................. 455/103, 455/552.1, 426.2, 41.2, 88, 42; 340/10.1, 340/572.7

See application file for complete search history.

(56) References Cited

U.S. PATENT DOCUMENTS 5,130,671 A 7/1992 Shahriary et al.
5,798,567 A 8/1998 Kelly et al.
6,060,433 A 5/2000 Li et al.
6,069,505 A 5/2000 Banezhad
6,181,218 B1 1/2001 Clark et al.
6,198,353 B1 3/2001 Janesch et al.
6,366,174 B1 4/2002 Berry et al.
6,628,163 B2 9/2003 Dathe
6,791,425 B2 9/2004 Kitamura
6,836,154 B2 12/2004 Fredriksson
6,842,710 B1 1/2005 Gehring et al.
7,038,625 B1 5/2006 Taylor et al.
7,046,098 B2 5/2006 Staszewski
7,209,706 B2 * 4/2007 Fujii et al. .................... 455/41.2
7,247,932 B1 7/2007 Lin et al.
7,317,363 B2 1/2008 Kousai et al.
7,345,575 B2 * 3/2008 Tuttle et al. .................. 340/10.1
7,356,423 B2 4/2008 Nehrig
7,432,751 B2 10/2008 Fang
7,880,677 B2 2/2011 Rofougaran et al.
2004/0041732 A1 3/2004 Aikawa et al.
2004/0201526 A1 10/2004 Knowles et al.
2004/0222506 A1 11/2004 Wei et al.
2005/0212642 A1 9/2005 Pleskach et al.
(Continued)

FOREIGN PATENT DOCUMENTS

EP 1146592 10/2001
(Continued)

*Primary Examiner* — Sanh Phu
(74) *Attorney, Agent, or Firm* — McAndrews, Held & Malloy, Ltd.

(57) ABSTRACT

Aspects of a method and system for reconfigurable devices for multi-frequency coexistence are provided. In this regard, an IC may be configured based on a frequency of signals processed by the IC. In instances that the IC may process signals of a first frequency, the IC may be configured such that a loop communicatively coupled to the integrated circuit may function as an inductor. In instances that the IC may process signals of a second frequency, the IC may be configured such that the loop may function as an antenna for transmitting and/or receiving the signals. The loop may be within and/or on the IC and/or a package such as a multilayer package to which the IC may be bonded. The loop may be fabricated with stripline and/or microstrip transmission line. In instances that the loop may function as an inductor, the loop may be communicatively coupled as part of a VCO tank circuit.

20 Claims, 5 Drawing Sheets

200A
104
206 Processor
208 Memory
Freq. Slct
207
210
202
Tx/Rx 1 204a
Tx/Rx 2 204b

U.S. PATENT DOCUMENTS

2005/0253646 A1 11/2005 Lin
2006/0033671 A1 2/2006 Chan et al.
2006/0152911 A1 7/2006 Humbert et al.
2007/0013051 A1 1/2007 Heyan et al.
2007/0139112 A1 6/2007 Bocock et al.
2007/0205748 A1 9/2007 Abou
2008/0048760 A1 2/2008 El Rai et al.
2008/0258806 A1 10/2008 Youssoufian et al.
2008/0291115 A1 11/2008 Doan et al.
2009/0153260 A1 6/2009 Rofougaran
2009/0153421 A1 6/2009 Rofougaran et al.
2009/0153427 A1 6/2009 Rofougaran
2009/0156157 A1 6/2009 Rofougaran et al.
2009/0179814 A1 7/2009 Park et al.
2009/0189064 A1 7/2009 Miller et al.
2009/0218701 A1* 9/2009 Rofougaran .................. 257/778
2009/0241392 A1* 10/2009 Long et al. ...................... 40/661
2009/0243741 A1 10/2009 Rofougaran
2009/0243749 A1 10/2009 Rofougaran
2009/0243767 A1 10/2009 Rofougaran

FOREIGN PATENT DOCUMENTS

WO W02007114620 10/2007

* cited by examiner

METHOD AND SYSTEM FOR RECONFIGURABLE DEVICES FOR MULTI-FREQUENCY COEXISTENCE

CROSS-REFERENCE TO RELATED APPLICATIONS/INCORPORATION BY REFERENCE

Not applicable.

FIELD OF THE INVENTION

Certain embodiments of the invention relate to wireless communications. More specifically, certain embodiments of the invention relate to a method and system for reconfigurable devices for multi-frequency coexistence.

BACKGROUND OF THE INVENTION

With the increasing popularity of various wireless standards and technologies, there is a growing demand to provide a simple and complete solution for wireless communications applications. In this regard, electronics manufacturers are increasingly attempting to incorporate multiple wireless technologies into wireless equipment.

Although desirable to users, incorporating multiple wireless communication technologies into common platform may pose problems in terms of cost and complexity. In this regard, each of a plurality of wireless technologies may require separate processing hardware and/or separate processing software. Moreover, coordinating the reception and/or transmission of data to and/or from the wireless equipment may require significant processing overhead that may impose certain operation restrictions and/or design challenges.

When multiple wireless technologies are incorporated in a single device, the number of analog components required for signal generation, filtering, and other purposes may significantly increase. Consequently, space may quickly become limited as analog blocks and components may require a significant amount of area.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for reconfigurable devices for multi-frequency coexistence, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for reconfigurable devices for multi-frequency coexistence. In various embodiments of the invention, an IC may be configured based on a frequency of signals processed by the IC. In instances that the IC may process signals of a first frequency, the IC may be configured such that a loop communicatively coupled to the integrated circuit may function as an inductor. In instances that the IC may process signals of a second frequency, the IC may be configured such that the loop may function as an antenna for transmitting and/or receiving the signals. The loop may be within and/or on the IC and/or a package to which the IC may be bonded. The loop may be fabricated with stripline and/or microstrip transmission line. Ferromagnetic material may be deposited within and/or on the IC and/or a package, such as a multilayer package, to which the IC may be bonded. The signals of a second frequency may be in and/or near the ISM band centered at 61.25 GHz. The loop may be communicatively coupled as part of a VCO to generate the signals of a first frequency.

Figure 1:
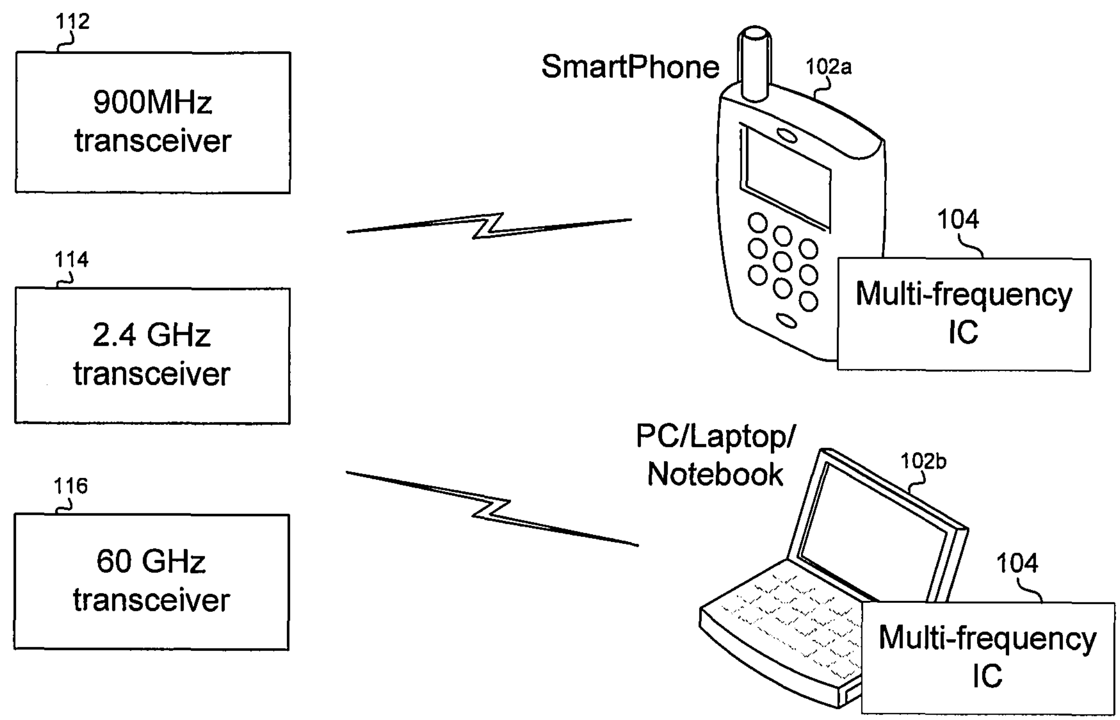
FIG. 1 is a diagram of an exemplary wireless system that may enable communication at a plurality of frequencies, in accordance with an embodiment of the invention.

FIG. 1 is a diagram of an exemplary wireless system that may enable communication at a plurality of frequencies, in accordance with an embodiment of the invention. Referring to FIG. 1, there is shown a smart phone 102*a*, and a laptop 102*b*, which may collectively be referred to as wireless communication devices 102. Each of the wireless communication devices 102 may comprise an integrated circuit (IC) 104 which may enable communication at a plurality of frequencies. Exemplary frequencies may comprise the industrial, scientific, and medical (ISM) bands around 900 MHz, 2.4 GHz, and 60 GHz.

The transceiver 112 may comprise suitable logic, circuitry and/or code that may enable wireless communication. The transceiver 112 operating at or near 900 MHz may, for example, comprise a cellular base station. Accordingly, the multi-frequency IC 104 may enable the wireless communication devices 102 to communicate with the transceiver 112. Thus, the IC 104 may comprise one or more tuned circuits which may be configured to enable communication at or near 900 MHz. In this regard, the IC 104 may comprise an inductor which may determine a frequency response of, for example, a VCO circuit. In various embodiments of the invention, the inductor may comprise a loop fabricated on chip and/or in a package to which the IC may be bonded. In this regard, the loop may be realized on-chip and/or in an IC package utilizing microstrip and/or strip line transmission media.

The transceiver 114 may comprise suitable logic, circuitry and/or code that may enable wireless communication. The transceiver 114 operating at or near 2.4 GHz may, for example, comprise a Bluetooth transceiver. Accordingly, the multi-frequency IC 104 may enable the wireless communication devices 102 to communicate utilizing Bluetooth. Thus, the IC 104 may comprise one or more tuned circuits which may be configured to enable communication at or near 2.4 GHz. In this regard, the IC 104 may comprise an inductor which may determine a frequency response of, for example, a VCO circuit. In various embodiments of the invention, the inductor may comprise a loop fabricated on chip and/or in a package to which the IC may be bonded. In this regard, the loop may be realized on-chip and/or in an IC package utilizing microstrip and/or strip line transmission media.

The transceiver 116 may comprise suitable logic, circuitry and/or code that may enable wireless communication. The 60 GHz transceiver 116, operating at or near 60 GHz, may, for example, enable high speed point-to-point communications. Accordingly, the multi-frequency IC 104 may enable the wireless communication devices 102 to communicate at or near 60 GHz. Due to the short wavelengths, an antenna for 60 GHz transmission may be sufficiently small so as to fit on chip and/or in the chip's package. In this regard, the IC 104 may comprise one or more loop antennas fabricated on chip and/or in the chip's package. The loop may be realized on-chip and/or in an IC package utilizing microstrip and/or strip line transmission media.

Accordingly, the IC 104 and/or a package to which the IC 104 may be bonded may comprise an inductive loop which at some frequencies may be utilized as an inductor and at other frequencies may be utilized as an antenna. Thus, the IC 104, and in particular the signals and/or circuits communicatively coupled to the loop, may be configured based on a frequency of operation. In various embodiments of the invention, ferromagnetic material may be deposited on and/or within the IC 104 such that magnetic flux in portions of the IC 104 may be enhanced.

Figure 2A:
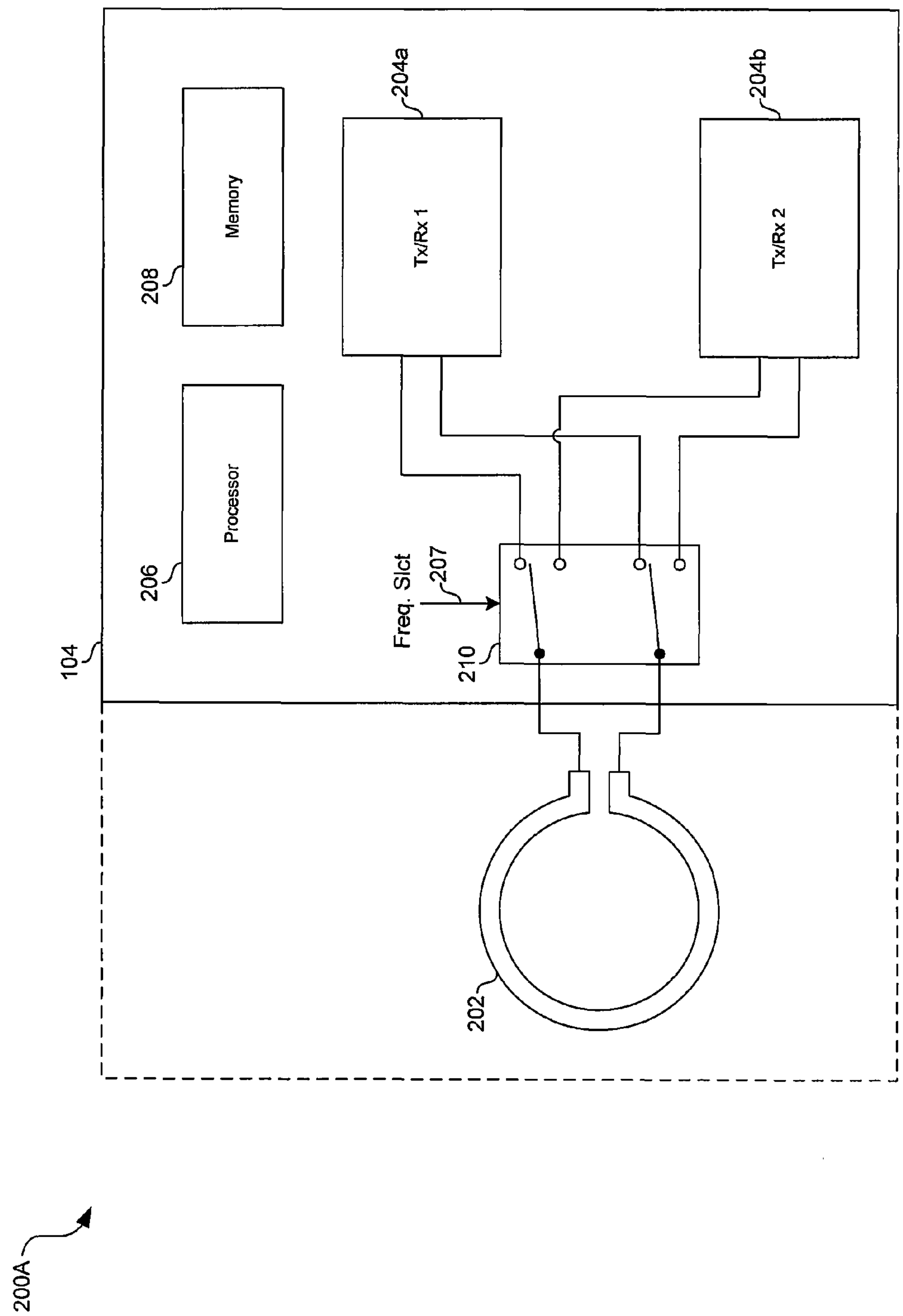
FIG. 2A is a diagram of an exemplary system configurable to utilize a loop as an inductor or as an antenna, in accordance with an embodiment of the invention.

FIG. 2A is a diagram of an exemplary system configurable to utilize a loop as an inductor or as an antenna, in accordance with an embodiment of the invention. Referring to FIG. 2A, the system 200A may comprise an IC 104 which may be as described with respect to FIG. 1. The IC 104 may comprise transceivers 204*a* and 204*b*, a processor 206, a memory 208, and a switching element 210. In various embodiments of the invention, a loop 202 may be fabricated on the IC 104 (as indicated by the dashed line) or may be fabricated on a package to which the IC 104 may be bonded.

The transceiver 204*a* may comprise suitable logic, circuitry, and/or code that may enable transmitting and/or receiving signals in a first frequency band. The transceiver 204*b* may comprise suitable logic, circuitry, and/or code that may enable transmitting and/or receiving signals in a second frequency band. In this regard, the transceiver 204*a* may utilize the loop 202 as an inductor and the transceiver 204*b* may utilize the loop 202 as an antenna. For example, the transceiver 202*a* may operate in the ISM band near 900 MHz and the transceiver 202*b* may operate in the ISM band near 60 GHz. The ISM bands near 900 MHz and 60 GHz are only exemplary different frequencies may be utilized without deviating from the scope of the present invention. Although a transceiver device is shown, the invention may not be so limited. Accordingly, various embodiments of the invention may comprise separate transmitters and/or receivers.

The processor 206 may comprise suitable logic, circuitry, and/or code that may enable control and/or data processing operations for the IC 104. The processor 206 may be utilized to control at least a portion of transceivers 203*a* and 204*b*, the switching element 210, and/or the memory 208. In this regard, the processor 206 may generate at least one signal for controlling operations within the IC 104. Furthermore, the processor 206 may provide one or more control signals for configuring the switching element 210 based on a frequency of operation. The processor 206 may also enable executing of applications that may be utilized by the wireless communication devices 102 described with respect to FIG. 1. For example, the processor 206 may execute applications that may enable displaying and/or interacting with content received via the transceivers 204*a* and 204*b*.

The memory 208 may comprise suitable logic, circuitry, and/or code that may enable storage of data and/or other information utilized by the wireless communication devices 102 described with respect to FIG. 1. For example, the memory 208 may be utilized for storing processed data generated by the processor 206 and/or the transceivers 204*a* and 204*b*. The memory 208 may also be utilized to store information, such as configuration information, that may be utilized to control the operation of at least one block in the IC 104. For example, the memory 208 may comprise information necessary to configure the switching element 210 based on a frequency of operation.

In various embodiments of the invention, the loop 202 may be fabricated in one or more metal layers of the IC 104 or in one or more metal layers of a package to which the IC 202 may be bonded. In this regard, transmission line media, such as microstrip and/or stripline, may be utilized to create the loop 202. In various embodiments of the invention, a plurality of loops may be in and/or on the IC 104 and/or a package to which the IC 104 may be bonded.

In operation, a frequency of operation may be determined by, for example, a user input or an automated routine executed by the processor 206. Accordingly, the frequency control signal 207 may be generated to control the switching element 210 such that the loop 202 is communicatively coupled to the appropriate transceiver.

Figure 2B:
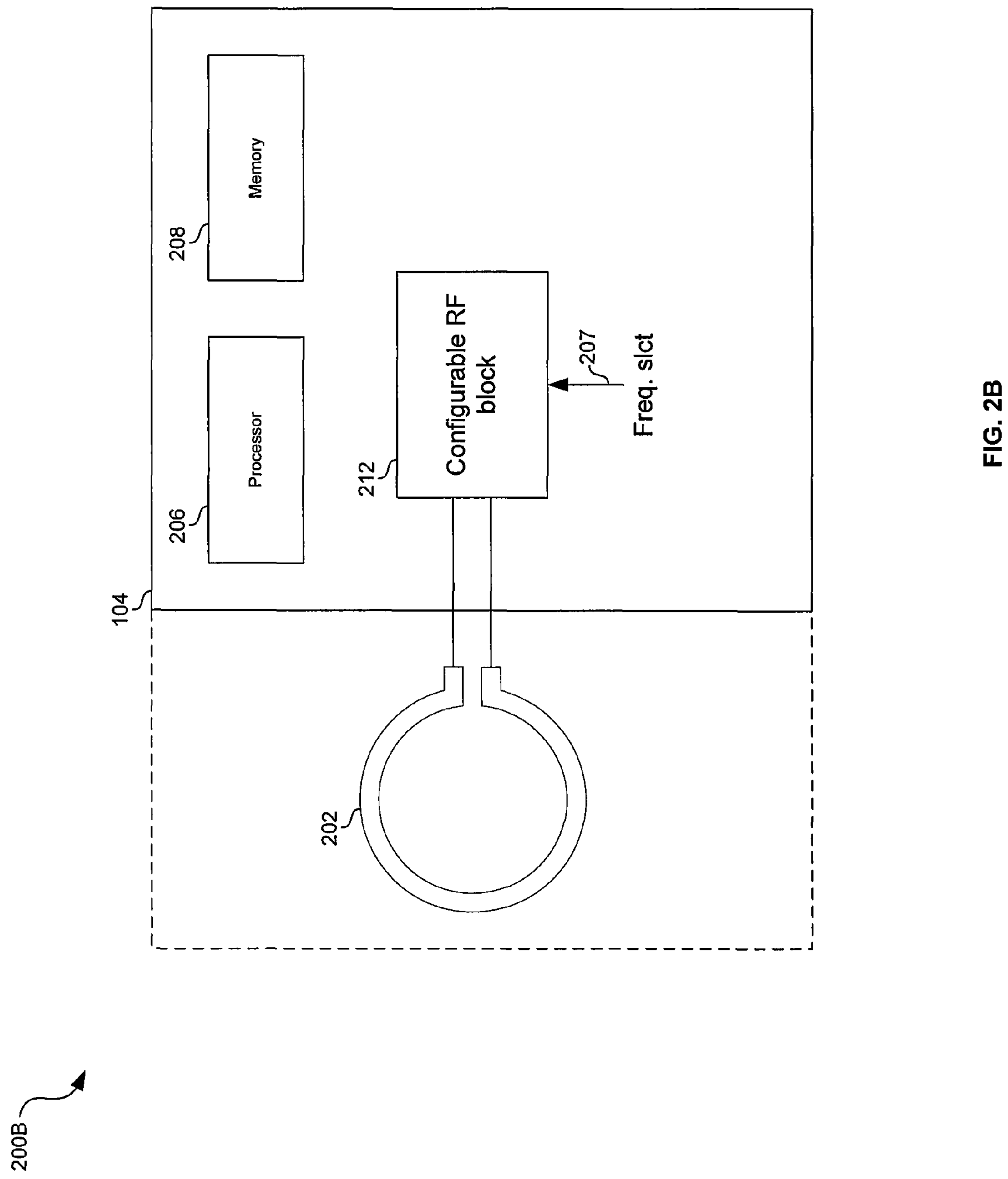
FIG. 2B is a diagram of another exemplary system configurable to utilize a loop as an inductor or as an antenna, in accordance with an embodiment of the invention.

FIG. 2B is a diagram of another exemplary system configurable to utilize a loop as an inductor or as an antenna, in accordance with an embodiment of the invention. The system 200B may comprise an IC 104 similar to or the same as the IC 104 in FIG. 1. In this regard, the IC 104 may comprise an RF block 212 which may be configurable based on a frequency of operation.

The RF block 212 may comprise suitable logic, circuitry and/or code that may enable transmission and/or reception of signals over a plurality of frequency bands. In an exemplary embodiment of the invention, the RF block 212 may comprise tuned circuitry and/or one or more transceivers enabled to operate in a plurality of frequency bands. For example, the RF block 212 may be configured to operate in the ISM band around 2.45 GHz or the ISM band around 60 GHz. In this regard, the loop 202 may be utilized as part of a VCO tank circuit at 2.4 GHz and may be utilized as an antenna at 60 GHz. The ISM bands near 2.4 GHz and 60 GHz are only exemplary and different frequencies may be utilized without deviating from the scope of the present invention.

Figure 3:
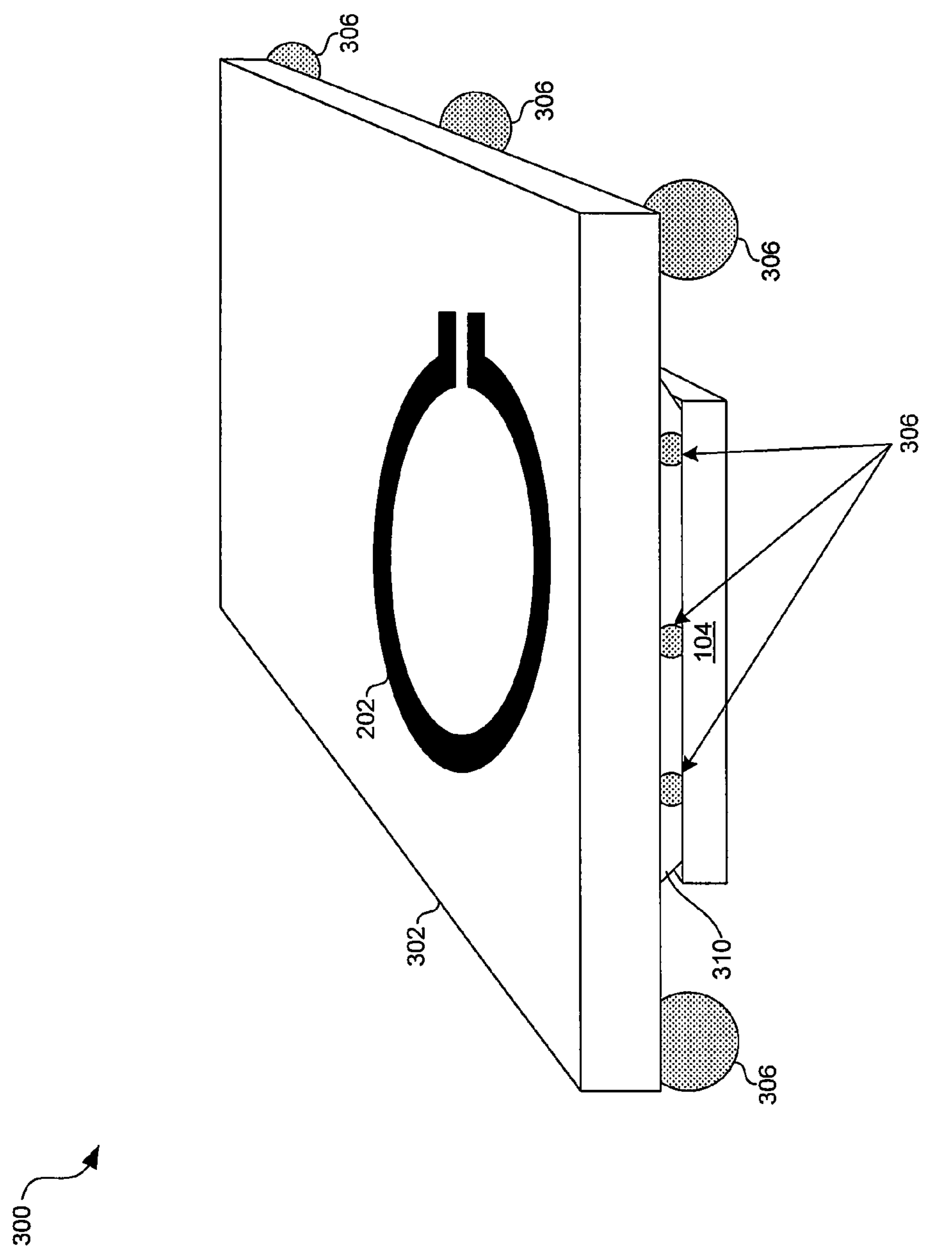
FIG. 3 illustrates a loop fabricated on an integrated circuit package, in accordance with an embodiment of the invention.

FIG. 3 illustrates a loop fabricated on an integrated circuit package, in accordance with an embodiment of the invention. Referring to FIG. 3, the system 300 may comprise an Integrated circuit (IC) package 302, an associated IC ("chip") 104, loop 202, and solder balls 306. In this regard, the system 300 may, for example, be referred to as a hybrid, a hybrid circuit, or a hybridized circuit.

The IC 104 may be as described with respect to FIGS. 1, 2A, and/or 2B. The IC 104 may be bump-bonded or flip-chip bonded to the multi-layer IC package 302 utilizing the solder balls 306. In this manner, wire bonds connecting the IC 104 to the multi-layer IC package 302 may be eliminated, reducing and/or eliminating stray inductances due to wire bonds. In addition, the thermal conductance out of the IC 104 may be greatly improved utilizing the solder balls 306 and the thermal epoxy 310. The thermal epoxy 310 may be electrically insulating but thermally conductive to allow for thermal energy to be conducted out of the IC 104 to the much larger thermal mass of the multilayer package 302.

The solder balls 306 may comprise spherical balls of metal to provide electrical, thermal and physical contact between the IC 104 and the multi-layer IC package 302. In making the contact with the solder balls 306, the IC 104 may be pressed with enough force to squash the metal spheres somewhat, and may be performed at an elevated temperature to provide suitable electrical resistance and physical bond strength. The solder balls 306 may also be utilized to provide electrical, thermal and physical contact between the multi-layer IC package 302 and a printed circuit board (not shown).

The multi-layer IC package 302 may comprise one or more layers of metal and/or insulating material (various embodiments may also comprise ferromagnetic and/or ferrimagnetic areas and/or layers). In this regard, the multi-layer IC package 302 may be fabricated in a manner similar to or the same as an integrated circuit. Accordingly, the layers may be utilized to realize circuit elements such as resistors, inductors, capacitors, transmission lines, switches (e.g., microelectromechanical switches), antennas, etc. In this regard, the loop 202 may be fabricated in and/or on the multi-layer IC package 302. The loop 202 may be similar to or the same as the loop described with respect to FIGS. 1, 2A, and 2B. The loop 202 may be fabricated in one or more metal layers in and/or on the multi-layer IC package 302. In this regard, microstrip and/or stripline may be utilized to delineate the loops 202*a* and 202*b*.

In operation, logic, circuitry, and/or code in the IC 104 and/or in another device coupled to the multi-layer IC package 302 (e.g., located on a PCB and coupled via one or more of the solder balls 306) may utilize the loop 202 as an inductor at lower frequencies and as an antenna at higher frequencies. Accordingly, one or more switching elements in and/or on the IC 104 and/or the multi-layer IC package 302 may be configured such that the loop 202 may be communicatively coupled to an appropriate signal and/or circuit.

Figure 4:
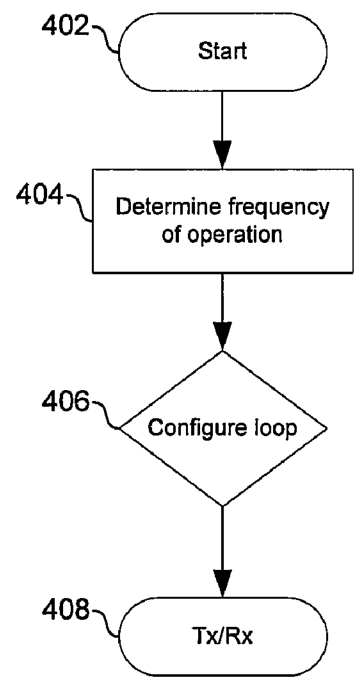
FIG. 4 is a flowchart illustrating exemplary steps for transmitting and/or receiving signals in a multi-frequency system comprising a loop, in accordance with an embodiment of the invention.

FIG. 4 is a flowchart illustrating exemplary steps for transmitting and/or receiving signals in a multi-frequency system comprising a loop, in accordance with an embodiment of the invention. Referring to FIG. 4, subsequent to start step 402, the exemplary steps may advance to step 404. In step 404, a frequency of operation of an IC, such as the IC 104, may be determined. In this regard, the frequency may be determined based on a type of network and/or device with which the IC 104 may desire to communicate. For example, a Smartphone comprising the chip 104 may communicate with a Bluetooth network in the 2.4 GHz ISM band, an RFID terminal in the 900 MHz ISM band, and may perform high speed point-to-point communications with another piece of wireless equipment in the 60 GHz ISM band.

Subsequent to step 404, the exemplary steps may advance to step 406. In step 406, one or more switches may be configured such that a loop, such as the loop 202, may be communicatively coupled to an appropriate signal and/or circuit. In an exemplary embodiment of the invention, the loop may be communicatively coupled to the output of a power amplifier for 60 GHz communications and the loop may be communicatively coupled as part of a VCO tank circuit for 2.4 GHz communications. Subsequent to step 406, the exemplary steps may advance to step 408. In step 408, the IC 104 and/or wireless equipment comprising the IC 104 may transmit and/or receive signals in the selected frequency band.

Aspects of a method and system for reconfigurable devices for multi-frequency coexistence are provided. In this regard, an IC, such as the IC 104, may be configured based on a frequency of signals processed by the IC. In instances that the IC 104 may process signals of a first frequency, the IC 104 may be configured such that a loop 202 communicatively coupled to the integrated circuit 104, such as the loop 202, may function as an inductor. In instances that the IC 104 may process signals of a second frequency, the IC 104 may be configured such that the loop 202 may function as an antenna for transmitting and/or receiving the signals. The loop 202 may be within and/or on the IC 104 and/or a package to which the IC 104 may be bonded, such as the package 302. The loop 202 may be fabricated with stripline and/or microstrip transmission line. Ferromagnetic material may be deposited within and/or on the IC 104 and/or a package to which the IC 104 may be bonded. The signals of a second frequency may be in and/or near the ISM band centered at 61.25 GHz. The loop 202 may be communicatively coupled as part of a VCO to generate the signals of a first frequency.

Another embodiment of the invention may provide a machine-readable storage, having stored thereon, a computer program having at least one code section executable by a machine, thereby causing the machine to perform the steps as described herein for reconfigurable devices for multi-frequency coexistence.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:

in an integrated circuit that processes signals in a plurality of frequency bands, configuring said integrated circuit based on a frequency of said signals, wherein:

for said signals in a first of said plurality of frequency bands, said integrated circuit is configured to utilize a loop communicatively coupled to said integrated circuit to function as an inductor; and for said signals in a second of said plurality of frequency bands, said integrated circuit is configured to utilize said loop as an antenna for transmitting and/or receiving said signals in said second of said plurality of frequency bands.

2. The method according to claim 1, wherein said loop is within and/or on said integrated circuit.

3. The method according to claim 1, wherein said integrated circuit is flip-chip bonded to an integrated circuit package and said loop is within and/or on said integrated circuit package.

4. The method according to claim 3, wherein ferromagnetic material is deposited on and/or within said integrated circuit package.

5. The method according to claim 1, wherein said loop is fabricated utilizing microstrip transmission line.

6. The method according to claim 1, wherein said loop is fabricated utilizing stripline transmission line.

7. The method according to claim 1, comprising transmitting a signal via said loop, wherein a frequency of said signal is in or near the ISM frequency band centered at 61.25 GHz.

8. The method according to claim 1, comprising receiving a signal via said loop, wherein a frequency of said signal is in or near the ISM frequency band centered at 61.25 GHz.

9. The method according to claim 1, wherein said loop is communicatively coupled as part of a voltage controlled oscillator tank circuit for generating said signals in said first of said plurality of frequency bands.

10. The method according to claim 1, wherein said integrated circuit comprises ferromagnetic material.

11. A system for signal processing, the system comprising:

one or more circuits in an integrated circuit that is configurable based on a frequency of signals processed by said one or more or more circuits, wherein:

for said signals in a first of said plurality of frequency bands, said one or more circuits is configured to utilize a loop communicatively coupled to said integrated circuit to function as an inductor; and for said signals in a second of said plurality of frequency bands, said one or more circuits is configured to utilize said loop as an antenna for transmitting and/or receiving said signals in said second of said plurality of frequency bands.

12. The system according to claim 11, wherein said loop is within and/or on said integrated circuit.

13. The system according to claim 11, wherein said integrated circuit is flip-chip bonded to an integrated circuit package and said loop is within and/or on said integrated circuit package.

14. The system according to claim 13, wherein ferromagnetic material is deposited on and/or within said integrated circuit package.

15. The system according to claim 11, wherein said loop is fabricated utilizing microstrip transmission line.

16. The system according to claim 11, wherein said loop is fabricated utilizing stripline transmission line.

17. The system according to claim 11, wherein said one or more circuits enables transmission of a signal via said loop, wherein a frequency of said signal is in or near the ISM frequency band centered at 61.25 GHz.

18. The system according to claim 11, wherein said one or more circuits enables reception of signals in or near the ISM frequency band centered at 61.25 GHz via said loop.

19. The system according to claim 11, wherein said loop is communicatively coupled as part of a voltage controlled oscillator tank circuit for generating said signals in said first of said plurality of frequency bands.

20. The system according to claim 11, wherein said integrated circuit comprises ferromagnetic material.

* * * * *